US012442067B2

(12) United States Patent
Singh et al.

(10) Patent No.: US 12,442,067 B2
(45) Date of Patent: Oct. 14, 2025

(54) CERAMIC METALLIC COATINGS

(71) Applicant: Valeo North America, Inc., Troy, MI (US)

(72) Inventors: Shivi Singh, Seymour, IN (US); Thomas Nolan, Seymour, IN (US); Rosangela Loiudice, Seymour, IN (US)

(73) Assignee: Valeo North America, Troy, MI (US)

( * ) Notice: Subject to any disclaimer, the term of this patent is extended or adjusted under 35 U.S.C. 154(b) by 454 days.

(21) Appl. No.: 15/441,469

(22) Filed: Feb. 24, 2017

(65) Prior Publication Data

US 2018/0245197 A1 Aug. 30, 2018

(51) Int. Cl.

| | |
|---|---|
| ***C23C 14/00*** | (2006.01) |
| ***C23C 14/06*** | (2006.01) |
| ***C23C 14/20*** | (2006.01) |
| ***C23C 14/35*** | (2006.01) |
| ***C23C 14/50*** | (2006.01) |
| ***C23C 14/54*** | (2006.01) |
| ***F21S 43/50*** | (2018.01) |
| ***F21S 45/10*** | (2018.01) |
| ***H01J 37/32*** | (2006.01) |
| ***H01J 37/34*** | (2006.01) |
| *B60R 13/02* | (2006.01) |
| *F21S 41/37* | (2018.01) |
| *F21S 41/50* | (2018.01) |
| *F21S 43/33* | (2018.01) |

(52) U.S. Cl.

CPC ...... *C23C 14/0015* (2013.01); *C23C 14/0057* (2013.01); *C23C 14/0063* (2013.01); *C23C 14/0641* (2013.01); *C23C 14/205* (2013.01); *C23C 14/352* (2013.01); *C23C 14/505* (2013.01); *C23C 14/548* (2013.01); *F21S 43/50* (2018.01); *F21S 45/10* (2018.01); *H01J 37/32449* (2013.01); *H01J 37/3405* (2013.01); *H01J 37/3429* (2013.01); *H01J 37/3476* (2013.01); *B60R 13/02* (2013.01); *F21S 41/37* (2018.01); *F21S 41/50* (2018.01); *F21S 43/33* (2018.01); *H01J 2237/332* (2013.01)

(58) Field of Classification Search

None

See application file for complete search history.

(56) References Cited

U.S. PATENT DOCUMENTS

| | | | | |
|---|---|---|---|---|
| 4,959,136 A * | 9/1990 | Hatwar | C23C 14/0036 | 204/192.15 |
| 5,231,306 A * | 7/1993 | Meikle | H01L 23/4827 | 257/750 |
| 6,013,320 A * | 1/2000 | Imhof | C08J 9/365 | 427/304 |
| 6,514,621 B1 * | 2/2003 | Marietti | B32B 17/10174 | 428/432 |
| 6,561,679 B1 * | 5/2003 | Erion | C23C 14/0015 | 362/293 |
| 2002/0154407 A1 * | 10/2002 | Frazier | C23C 16/401 | 359/507 |
| 2005/0185518 A1 * | 8/2005 | Kawakami | C23C 14/0015 | 368/232 |
| 2006/0070877 A1 * | 4/2006 | Tilsch | H01J 37/32541 | 204/298.27 |
| 2007/0160786 A1 * | 7/2007 | Levin | B32B 27/08 | 428/35.2 |
| 2007/0202344 A1 * | 8/2007 | Schettler | C08J 7/045 | 428/446 |
| 2010/0072058 A1 | 3/2010 | Chiang et al. | | |
| 2011/0135898 A1 † | 6/2011 | Bohlmark | | |
| 2012/0121349 A1 * | 5/2012 | Mihic | B23B 31/005 | 408/143 |
| 2012/0304692 A1 | 12/2012 | Derrig | | |
| 2013/0302596 A1 † | 11/2013 | Vetter | | |
| 2017/0009334 A1 * | 1/2017 | Ciraldo | C23C 14/081 | |
| 2020/0056256 A1 * | 2/2020 | Takajo | C21D 8/0236 | |

FOREIGN PATENT DOCUMENTS

| | | |
|---|---|---|
| CA | 2 294 658 C | 3/2009 |
| CN | 1651267 A | 8/2005 |
| CN | 1804113 A | 7/2006 |

(Continued)

OTHER PUBLICATIONS

English machine translation of JP 03146655 (1991).*

English machine translation of JP2005194595 (2005).*

Moritz to Baben Article Unprecedented Thermal Stability of TiAlN (2016).*

Ph. Roquiny, et al., "Colour control of titanium nitride coatings produced by reactive magnetron sputtering at temperatures less than 100° C.", Surface and Coatings Technology, vol. 116-119, 1999, pp. 278-283.

R. K. Choudhary, et al., "Structural and Optical Properties of Aluminum Nitride Thin Films Deposited by Pulsed DC Magnetron Sputtering", Hindawi Publishing Corporation, ISRN Materials Science, vol. 2013, Article ID 759462, 2013, 5 pages.

(Continued)

*Primary Examiner* — Callie E Shosho

(74) *Attorney, Agent, or Firm* — Valeo North America

(57) ABSTRACT

A magnetron sputtering apparatus includes a first independent sputtering target power supply, a second independent sputtering target power supply, a process gas port, a reactive gas port, a vacuum chamber configured to house the first independent sputtering target power supply, the second independent sputtering target power supply, the process gas port, the reactive gas port, and a platform for placing a part for deposition of a coating by the magnetron sputtering apparatus, and processing circuitry. The processing circuitry is configured to alternately sputter a first target and a second target by alternately switching between the first independent sputtering target power supply and the second independent sputtering target power supply, respectively, and control one or more process parameters to yield a predetermined color of the coating deposited onto the part.

10 Claims, 11 Drawing Sheets

(56) References Cited

FOREIGN PATENT DOCUMENTS

| | | | | |
|---|---|---|---|---|
| CN | 103215555 | A | | 7/2013 |
| EP | 0 257 783 | A1 | | 3/1988 |
| EP | 1 231 291 | A1 | † | 8/2002 |
| JP | 03146655 | A | * | 6/1991 |
| JP | 2005194595 | A | * | 7/2005 |
| WO | WO 01/09051 | A1 | | 2/2001 |
| WO | WO 2009/069150 | A1 | | 6/2009 |

OTHER PUBLICATIONS

Masato Nishimura, et al., "Structural-Color-Control by AIN Coating on Rough-Surface AI Film", Materials Transactions, vol. 44, No. 11, 2003, pp. 2417-2419.

Office Action issued Oct. 9, 2019 in Chinese Application No. 201810156140.6 with English Translation, 17 pages.

Gang, T., "Preparation of TiA 1 N Thin Films by Mid-Frequency Unbalanced Magnetron Sputtering and Study of Their Properties", China Excellent Master's Thesis Full-text Database, Engineering Technology I, Feb. 15, 2015, pp. B020-B502.

The State Intellectual Property Office of People's Republic of China, The Second Office Action for corresponding Chinese application No. 201810156140.6 (including English translation), dated Jun. 23, 2020.

The State Intellectual Property Office of People's Republic of China, The Third Office Action of corresponding Chinese Patent Application No. 201810156140.6, dated Feb. 3, 2021 (including English translation).

Vetter, et al. "An Innovative Approach to New Hybrid Coatings based on HiPIMS Technology: The HI3 Process," Oct. 5, 2012 ("Vetter 2012").†

* cited by examiner
† cited by third party

| Recipe | Base Layer | Power (kW) | Ar Gas (Sccm) | N Gas (Sccm) | Time (sec) | Reactive Layer | Power (kW) | Ar Gas (Sccm) | N Gas (Sccm) | Time (sec) | Protective Topcoat | Power (kW) | HMDSO (Sccm) | Time (sec) | Color |
|---|---|---|---|---|---|---|---|---|---|---|---|---|---|---|---|
| 1 | Copper | 50 | 240 | 0 | 36 | No | | | | | yes | 5 | 240 | 60 | Copper/Penny |
| 2 | Copper | 12 | 240 | 0 | 18 | No | | | | | yes | 5 | 240 | 30 | Black with Brown undertone |
| 3 | Copper | 12 | 240 | 0 | 12 | No | | | | | yes | 5 | 240 | 30 | Black |
| 4 | Copper | 30 | 240 | 0 | 24 | No | | | | | yes | 5 | 240 | 60 | Rose Gold |
| | Aluminum | 12 | | | | | | | | | | | | | |
| 5 | No | | | | | Aluminum | 40 | 200 | 200 | 42 | yes | 5 | 240 | 30 | Black with Green undertone |
| 6 | Aluminum | 40 | 240 | 0 | 30 | Aluminum | 40 | 200 | 50 | 60 | yes | 5 | 240 | 60 | Brown Gold |
| 7 | Aluminum | 40 | 240 | 0 | 30 | No | | | | | yes | 5 | 240 | 30 | Silver |
| 8 | Aluminum | 40 | 240 | 0 | 30 | Titanium | 60 | 0 | 500 | 60 | yes | 7 | 240 | 60 | Deep Gold |
| 9 | Aluminum | 40 | 240 | 0 | 30 | Titanium | 40 | 0 | 300 | 60 | yes | 7 | 240 | 60 | Light Gold |
| 10 | Titanium | 60 | 240 | 0 | 36 | No | | | | | yes | 7 | 240 | 60 | Silver Gold |
| 11 | Titanium | 20 | 240 | 0 | 24 | No | | | | | No | | | | Black with Brass undertone |
| 12 | No | | | | | Titanium | 20 | 180 | 240 | 90 | yes | 7 | 240 | 30 | Black with Silver undertone |
| | | | | | | Aluminum | 30 | | | | | | | | |
| 13 | No | | | | | Titanium | 60 | 180 | 400 | 60 | No | | | | Black with Blue undertone |
| 14 | Aluminum | 40 | 240 | 0 | 30 | Titanium | 40 | 120 | 400 | 150 | yes | 5 | 240 | 30 | Sea Green |
| | | | | | | Aluminum | 40 | | | | | | | | |
| 15 | Aluminum | 40 | 240 | 0 | 30 | Titanium | 40 | 240 | 300 | 90 | yes | 5 | 240 | 30 | Bronze |
| | | | | | | Aluminum | 40 | | | | | | | | |
| 16 | Titanium | 40 | 240 | 0 | 30 | Titanium | 40 | 120 | 400 | 130 | No | | | | Blue |
| | | | | | | Aluminum | 40 | | | | | | | | |
| 17 | Titanium | 40 | 180 | 0 | 30 | Titanium | 40 | 100 | 300 | 120 | No | | | | Violet |
| | | | | | | Aluminum | 20 | | | | | | | | |
| 18 | Titanium | 40 | 240 | 0 | 30 | Titanium | 40 | 0 | 500 | 130 | No | | | | Red Bronze |
| 19 | Titanium | 40 | 240 | 0 | 30 | Titanium | 40 | 0 | 500 | 90 | No | | | | Brass |
| 20 | Titanium | 40 | 240 | 0 | 30 | Titanium | 40 | 0 | 500 | 60 | No | | | | Light Brass |

Fig. 5

CERAMIC METALLIC COATINGS

BACKGROUND

Processes for coating a plastic flexible part usually require a thick coating in order to accommodate the flexing of the part. The coating tends to delaminate with the flexing. In addition, the coated plastic part does not exhibit a metallic look.

Sputtering a coating onto a plastic flexible part is possible. However, only one color can be used at a time in the sputtering process.

The "background" description provided herein is for the purpose of generally presenting the context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY

Embodiments described herein include the following aspects.

(1) A method of treating and coating a part includes placing the part into a vacuum chamber of a magnetron sputtering apparatus, igniting a plasma in the vacuum chamber, alternately or simultaneously sputtering a first target at a first power level and a second target at a second power level, via the plasma, chemically-reacting components of the sputtered first target, the sputtered second target, and a reactive gas, depositing a coating of the chemically-reacted components onto the part; and controlling one or more process parameters of the magnetron sputtering apparatus to yield a predetermined color of the coating deposited onto the part.

(2) The method of treating and coating a part of (1), wherein the first target includes titanium and the second target includes aluminum.

(3) The method of treating and coating a part of either one of (1) or (2), further includes introducing a process gas into the vacuum chamber during the plasma.

(4) The method of treating and coating a part of any one of (1) through (3), wherein the process gas is a second reactive gas.

(5) The method of treating and coating a part of any one of (1) through (4), wherein the reactive gas includes nitrogen.

(6) The method of treating and coating a part of any one of (1) through (5), wherein the process parameters include a flow rate of the reactive gas, a flow rate of the process gas, the first power level, the second power level, and a time of alternate or simultaneous sputtering.

(7) The method of treating and coating a part of any one of (1) through (6), wherein the part includes one of polycarbonate or high-temperature polycarbonate.

(8) The method of treating and coating a part of any one of (1) through (7), further includes applying a glow discharge to the part prior to depositing the coating.

(9) The method of treating and coating a part of any one of (1) through (8), further includes applying a base layer to the part after applying the glow discharge and prior to depositing the coating.

(10) The method of treating and coating a part of any one of (1) through (9), wherein the base layer includes one of a titanium layer or an aluminum layer.

(11) The method of treating and coating a part of any one of (1) through (10), further includes applying a protective layer onto the part after depositing the coating onto the part.

(12) The method of treating and coating a part of any one of (1) through (11), wherein the protective layer includes one of hexymethyldisiloxane (HMDSO) or tetramethyldisiloxane (TMDSO).

Another embodiment of the disclosure is a product obtained by the process described above in (1) through (12).

(13) A magnetron sputtering apparatus includes a first independent sputtering target power supply, a second independent sputtering target power supply, a process gas port, a reactive gas port, a vacuum chamber configured to house the first independent sputtering target power supply, the second independent sputtering target power supply, the process gas port, the reactive gas port, and a platform for placing a part for deposition of a coating by the magnetron sputtering apparatus, and processing circuitry. The processing circuitry is configured to alternately sputter a first target and a second target by alternately switching between the first independent sputtering target power supply and the second independent sputtering target power supply, respectively, and control one or more process parameters to yield a predetermined color of the coating deposited onto the part.

(14) The magnetron sputtering apparatus of (13), wherein the processing circuitry is further configured to control a flow rate of a reactive gas introduced into the vacuum chamber via the reactive gas port.

(15) The magnetron sputtering apparatus of either one of (13) or (14), wherein the processing circuitry is further configured to independently control an amount of the sputtered first target and an amount of the sputtered second target deposited onto the part.

(16) The magnetron sputtering apparatus of any one of (13) through (15), wherein the processing circuitry is further configured to control the amount of the sputtered first target and the amount of the sputtered second target deposited onto the part by controlling a power level of the first independent sputtering target power supply and a power level of the second independent sputtering target power supply.

(17) A treated and coated part, including a substrate having a glow-discharged surface; a base layer adhered to the substrate, wherein the base layer is a soft metal layer; a sputtered coating adhered to the base layer, wherein the sputtered coating is a chemically-reactive non-stoichiometric ceramic metallic coating; and a protective coating adhered to the sputtered coating, wherein a resulting color of the treated and coated part varies with one or more of a composition of the base layer, a composition of one or more sputtering targets of the chemically-reactive non-stoichiometric ceramic metallic coating, or a composition of a sputtering reactive gas.

(18) The treated and coated part of (17), wherein the resulting color of the treated and coated part has no color dyes present.

(19) The treated and coated part of either (17) or (18), wherein the substrate includes one of an automotive reflector, an automotive bezel, or an automotive trim piece.

(20) The treated and coated part of any one of (17) through (19), wherein the substrate includes one of an automotive lamp reflector, an automotive lamp bezel, or an automotive lamp trim piece.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 5 is a table illustrating a plurality of recipes used to obtain a specific color on a substrate according to one embodiment;

DETAILED DESCRIPTION

Embodiments described herein provide systems of and methods for reactive sputtered coatings. In particular, metal nitride coatings are applied to plastic automotive parts to provide a metallic appearance capable of surviving a harsh automotive lamp environment.

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in the specification, but rather is defined by the claims.

In the interest of clarity, not all of the features of the implementations described herein are shown and described in detail. It will be appreciated that in the development of any such actual implementation, numerous implementation-specific decisions will be made in order to achieve the developer's specific goals, such as compliance with application- and business-related constraints, and that these specific goals will vary from one implementation to another and from one developer to another.

Figure 1A:
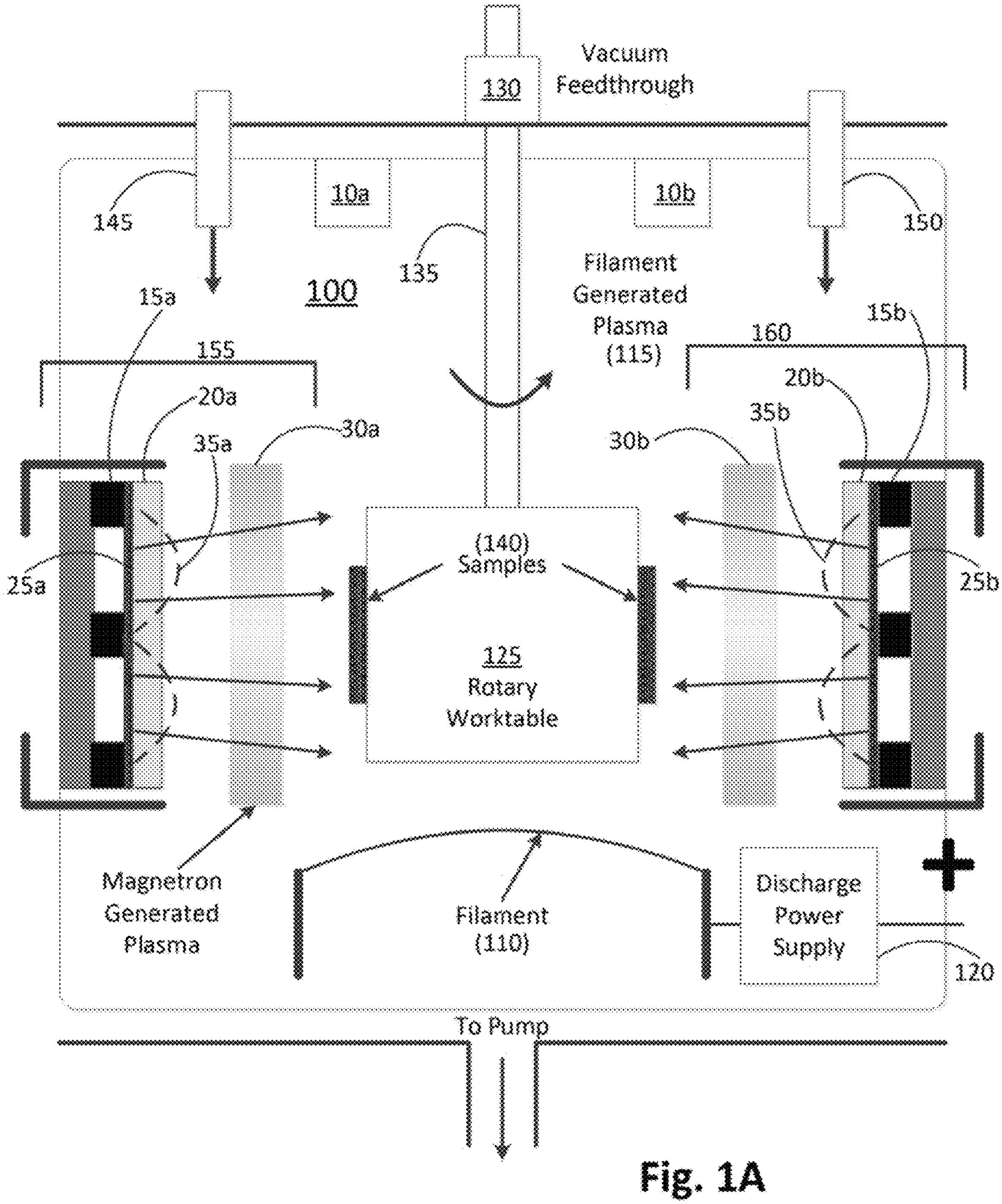
FIG. 1A is a cross-sectional view of an exemplary vacuum chamber of a magnetron sputtering apparatus according to one embodiment.

FIG. 1A is a cross-sectional view of a vacuum chamber 100 of a magnetron sputtering apparatus according to one embodiment. A filament 110 provides a filament generated plasma 115 within the vacuum chamber 100, via a discharge power supply 120.

A rotary worktable 125 is driven by a driving motor 130 by means of a rotating shaft 135. A plurality of samples 140, such as substrates is affixed to sides of the rotary worktable 125. However, a single sample 140 could be present on the rotary worktable 125. FIG. 1A also illustrates a process gas port 145 and a reactive gas port 150.

Vacuum chamber 100 also illustrates a first sputtering target apparatus 155 and a second sputtering target apparatus 160. Each sputtering target apparatus 155 and 160 works in conjunction with a respective first independent sputtering target power supply 10*a* and a second independent sputtering target power supply 10*b*. The first and second independent sputtering target power supplies 10*a* and 10*b* are configured to operate independently. As a result, the first and second independent sputtering target power supplies 10*a* and 10*b* can operate at different power levels and at different sputtering frequencies. In addition, the first and second independent sputtering target power supplies 10*a* and 10*b* can sputter simultaneously or alternately.

Each sputtering target apparatus 155 and 160 includes a respective first magnetron 15*a* and a second magnetron 15*b*, each of which includes a plurality of magnets. A first target 20*a* and a second target 20*b* are attached to their respective magnetrons 15*a* and 15*b*, via a respective first backing plate 25*a* and a second backing plate 25*b*. Targets 20*a* and 20*b* can be the same target material or a different target material. Embodiments herein describe sputtering a first target material 20*a* that combines with a specified reactive gas and sputtering a different second target material 20*b* that combines with the same or a different reactive gas to form a coating on the samples 140.

A first magnetron generated plasma 30*a* and a second magnetron generated plasma 30*b* are formed between the respective targets 20*a* and 20*b* and the samples 140 during operation of the magnetron sputtering apparatus. First magnetic fields 35*a* and second magnetic fields 35*b* are also generated during operation of the magnetron sputtering apparatus. Target material is sputtered from the respective targets 20*a* and 20*b* towards the samples 140 during operation of the magnetron sputtering apparatus. Rotation of the samples 140, via the rotary worktable 125 provides a uniform coating onto the samples 140.

Figure 1B:
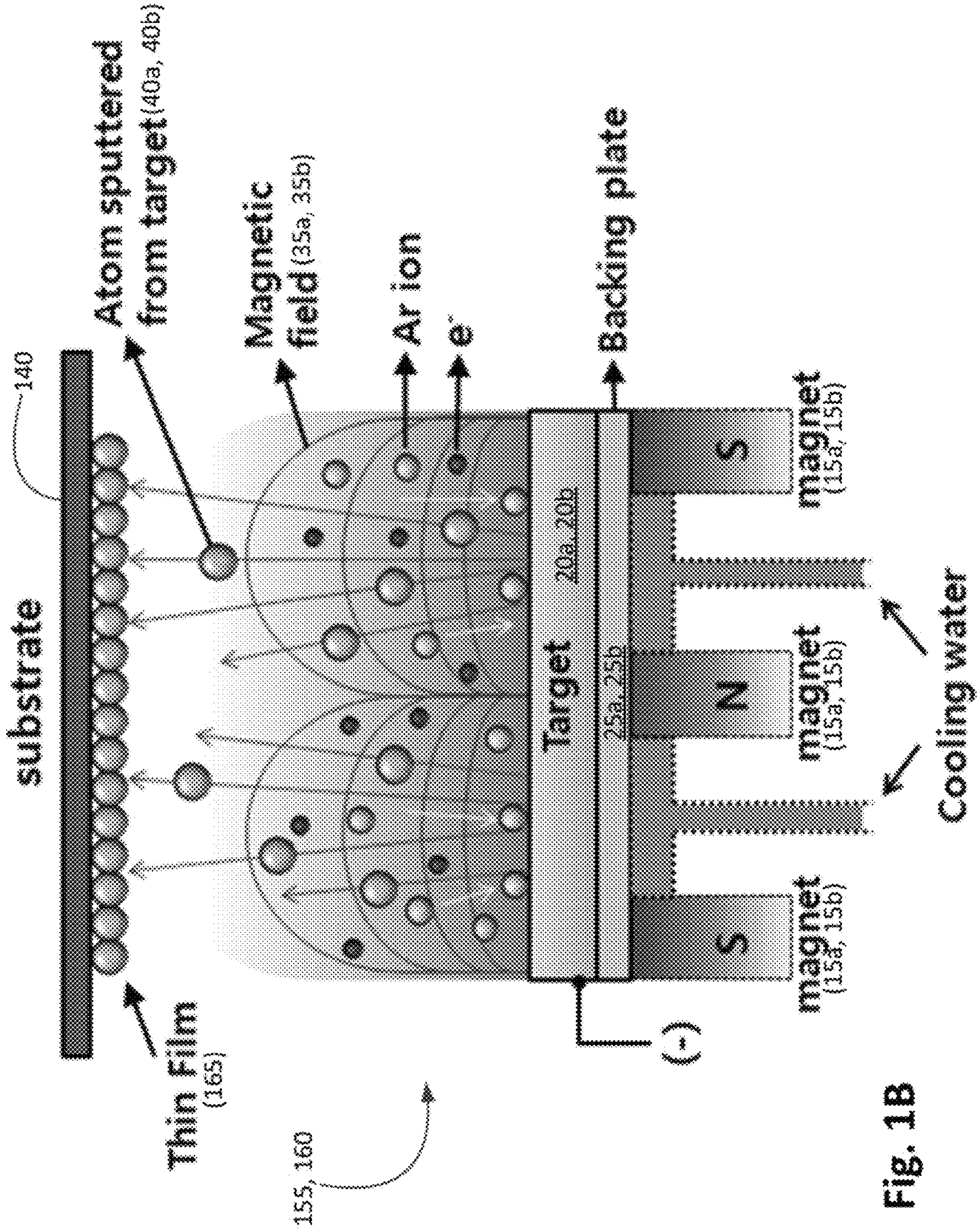
FIG. 1B illustrates a perspective view of an exemplary first sputtering target apparatus and a second sputtering target apparatus according to one embodiment.

FIG. 1B illustrates a different perspective view of the first sputtering target apparatus 155 and the second sputtering target apparatus 160. Targets 20*a* and 20*b* are affixed to their respective backing plates 25*a* and 25*b* and onto their respective magnetrons 15*a* and 15*b*. Magnetic fields 35*a* and 35*b* are generated during operation of the magnetron sputtering apparatus. As a result, atoms 40*a* and 40*b* are sputtered from their respective targets 20*a* and 20*b*. The sputtered atoms 40*a* and 40*b* react with a specified reactive gas to form a thin film coating 165 onto the substrate sample 140.

Figure 2:
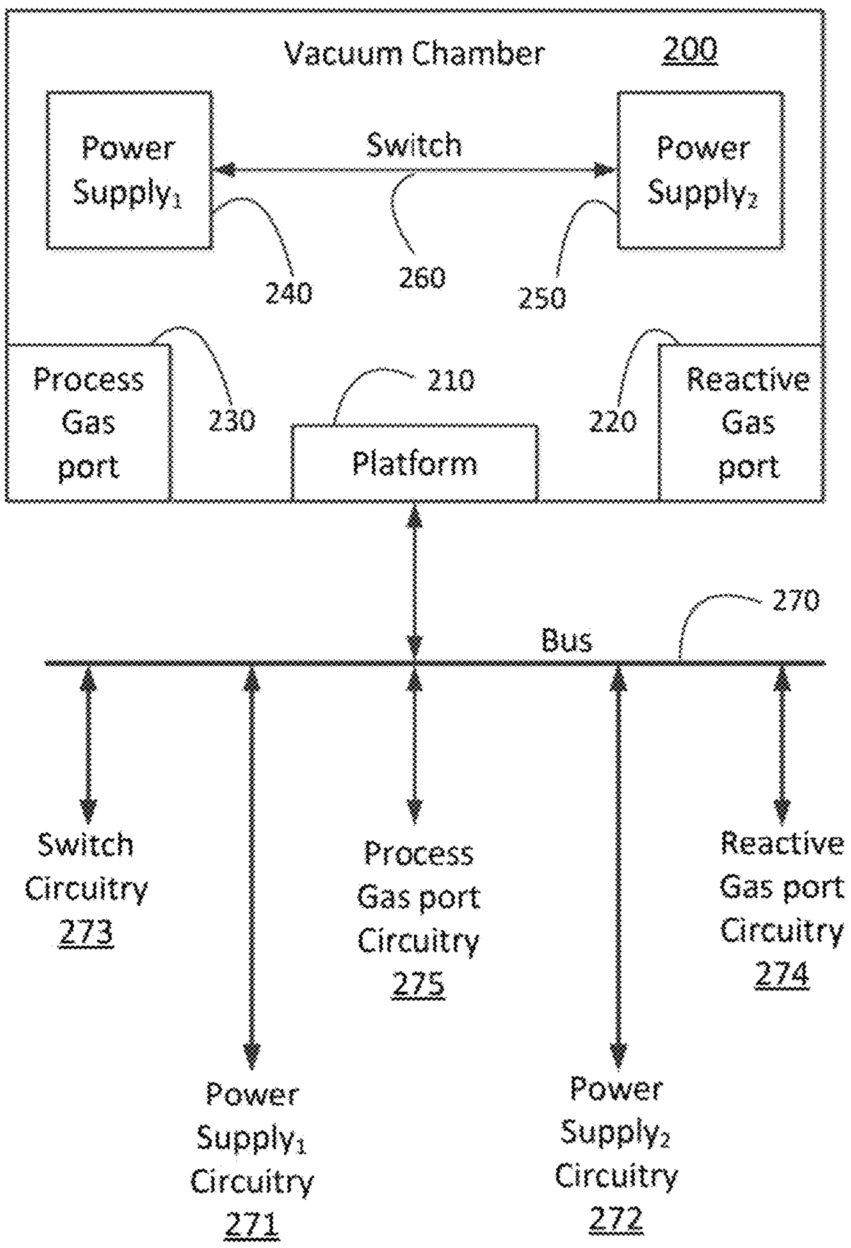
FIG. 2 is a block diagram illustrating a vacuum chamber of a magnetron sputtering apparatus according to one embodiment.

FIG. 2 is a block diagram illustrating a vacuum chamber 200 of a magnetron sputtering apparatus according to embodiments described herein. Vacuum chamber 200 includes a platform 210, such as a reel platform in which a part is placed during a sputtering deposition process. A reactive gas port 220 introduces a reactive gas into the vacuum chamber 200 during the sputtering deposition process. A process gas port 230 introduces process gas/gases into the vacuum chamber 200 during the sputtering deposition process.

Vacuum chamber 200 includes a first independent sputtering target power supply 240, which controls the power used for the sputtering of an associated first target material. Vacuum chamber 200 also includes a second independent sputtering target power supply 250, which controls the power used for the sputtering of an associated second target material.

The first independent sputtering target power supply 240 and the second independent sputtering target power supply 250 are connected by a switch 260. The switch 260 is configured to alternate power supplied to the first independent sputtering target power supply 240 and the second independent sputtering target power supply 250. The sputtered material from the first target material and the second target material chemically react with a reactive gas introduced into the vacuum chamber 200, via the reactive gas port 220. The chemically-reacted composition adheres to the part located on the reel platform 210.

The vacuum chamber 200 illustrated in FIG. 2 is not drawn to scale, and the layout of the components located therein may differ from an actual vacuum chamber. In an example, platform 210 is centrally located such that the sputtered materials and the reactant gas have adequate time to chemically react prior to coating the part mounted on the platform 210. Air flow ducts may be present to assist in completely and adequately coating the mounted part.

FIG. 2 is given for illustrative purposes only and does not include all components of a vacuum chamber 200. In addition, more than two power supplies associated with more than two target materials in vacuum chamber 200 are contemplated by embodiments described herein.

FIG. 2 also includes a bus 270 having processing circuitry configured to execute embodiments as described herein. Bus 270 is illustrated as a separate component from vacuum chamber 200 but connected to vacuum chamber 200 for transmitting and receiving communication signals between the vacuum chamber 200 and the bus 270 during a reactive sputtering process. In another embodiment, bus 270 is an integral component of vacuum chamber 200.

Bus 270 controls the execution of the reactive sputtering process. Power $supply_1$ circuitry 271 connected to bus 270 controls execution of power $supply_1$ 240, such as the power level of power $supply_1$ 240. Power $supply_2$ circuitry 272 connected to bus 270 controls execution of power $supply_2$ 250, such as the power level of power $supply_2$ 250. Switch circuitry 273 connected to bus 270 controls alternation of power supply activation between power $supply_1$ 240 and power $supply_2$ 250. Switch circuitry 273 determines the length of time of activation alternating between power $supply_1$ 240 and power $supply_2$ 250.

In one embodiment, the length of time for a single activation of power $supply_1$ 240 and power $supply_2$ 250 is the same. In another embodiment, the length of time for a single activation of power $supply_1$ 240 and power $supply_2$ 250 is different. In an example, the length of time for activation of either power $supply_1$ 240 or power $supply_2$ 250 during alternation of power supplies can be in a time range of approximately 10-500 milliseconds.

Reactive gas port circuitry 274 is also connected to bus 270. Reactive gas port circuitry 274 is configured to control the flow of reactant gas into the vacuum chamber 200. Control parameters include, but are not limited to reactant gas flow rate, length of time of reactant gas flow rate, and introduction or mixture of more than one reactant gas.

Process gas port circuitry 275 is also connected to bus 270. Process gas port circuitry 275 is configured to control the flow of process gas into the vacuum chamber 200. Control parameters include, but are not limited to process gas flow rate, length of time of process gas flow rate, and introduction of more than one process gas. Bus 270 controls the interaction and timing of reactive gas port circuitry 274 and process gas port circuitry 275.

Figure 3A:
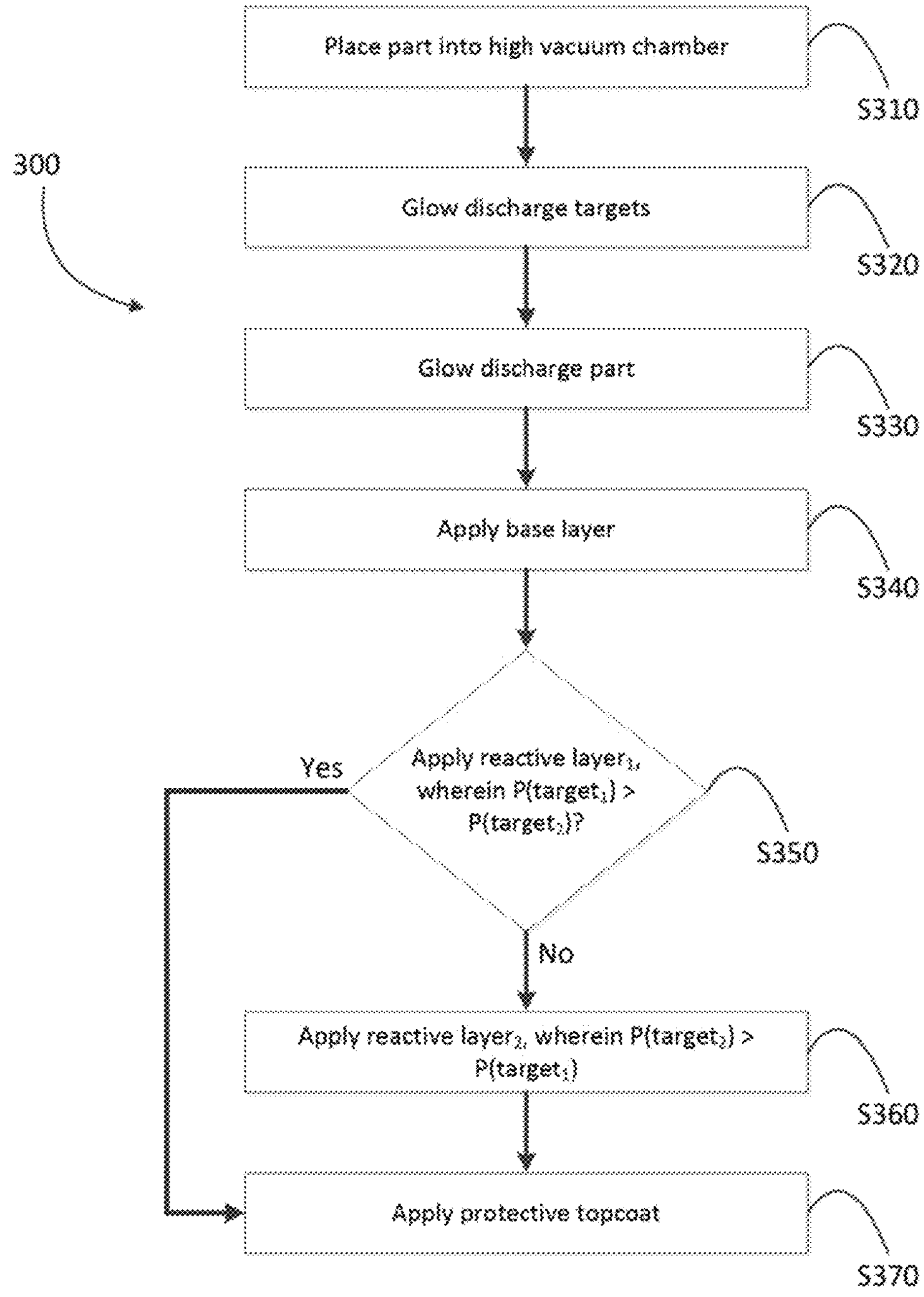
FIG. 3A illustrates a first exemplary algorithm for a process of coating a substrate using a magnetron sputtering apparatus according to one embodiment.

FIG. 3A illustrates a first exemplary algorithm 300 for a process of coating a substrate using a magnetron sputtering apparatus, such as a magnetron sputtering apparatus using the vacuum chamber 200 illustrated in FIG. 2.

In step S310, a substrate is placed into the high vacuum chamber of the magnetron sputtering apparatus for application of a sputtered coating onto the substrate. In one embodiment, the substrate can be an automotive part and in particular, the substrate can be a component of an automotive lamp. In a second embodiment, the substrate can be made of plastic and in particular, the substrate can be made of polycarbonate or high-temperature polycarbonate.

In step S320, targets within the vacuum chamber are exposed to a glow discharge to remove oxides and/or other contaminants from the targets. As illustrated in FIG. 2, there is a plurality of target sources, such as target $source_1$ and target $source_2$.

In step S330, the substrate is exposed to a glow discharge to remove any gases from the substrate. In addition, the glow discharge roughens the substrate, such that a subsequent layer adheres to the substrate better.

In step S340, a base layer is applied. In one embodiment, the base layer includes a titanium layer or an aluminum layer. However, the base layer can include other components, such as silver, nickel, and steel in which the base layer is a soft metal layer that adheres the substrate to a subsequent sputtered coating. In one embodiment, the base layer is approximately 20-100 nm thick.

In step S350, it is determined whether a reactive $layer_1$ is applied to the substrate, wherein a sputtering power level of $target_1$ is greater than a sputtering power level of $target_2$. The reactive $layer_1$ is formed using a reactive gas, such as nitrogen. A process gas, such as argon is also introduced into the vacuum chamber. The reactive layer, is formed by simultaneously sputtering $target_1$ and $target_2$, which reacts with the reactive gas to form a sputtered coating onto the substrate in the vacuum chamber. When the sputtering power level of $target_1$ is greater than the sputtering power level of $target_2$, a greater amount of $target_1$ is present in the sputtered coating. For example, when $target_1$ is titanium and $target_2$ is aluminum and the reactive gas is nitrogen, the sputtered coating includes a non-stoichiometric $Ti_xAl_yN_z$ layer, wherein x is greater than y, and z designates an amount of nitrogen in the coating. Nitride provides a hard sputtered coating. Therefore, the hardness can be increased by increasing the amount of nitrogen. The addition of nitrogen leads to formation of a hard nitride layer. The hardness of the coating can be increased by increasing the thickness of the reactive layer.

Step S350 illustrates an embodiment in which the amounts of $target_1$ and $target_2$ are controlled by varying the respective sputtering power levels of $target_1$ and $target_2$. However, other parameters can control the amounts of $target_1$ and $target_2$ in the sputtered coating. Parameters include, but are not limited to a flow rate of the reactive gas, a time of sputtering each target material, and a total time of alternately sputtering the target materials.

An individual time slot in which each target is sputtered can vary and will depend in part, on the desired non-stoichiometric amount of each target in the final sputtered coating. However, the individual time slot for sputtering a target material is less than an amount of time for a first sputtered target material to adhere onto a second target material. Therefore, the sputtering will alternate between targets fast enough, such that there is no sputtered material build-up on either target material.

If reactive $layer_1$ is not applied to the substrate (a "NO" decision in step S350), a reactive $layer_2$ is applied to the substrate in step S360, wherein a sputtering power level of $target_2$ is greater than a sputtering power level of $target_1$. When the sputtering power level of $target_2$ is greater than the sputtering power level of $target_1$, a greater amount of $target_2$ is present in the sputtered coating. For example, when $target_1$ is titanium and $target_2$ is aluminum and the reactive gas is nitrogen, the sputtered coating includes a non-stoichiometric $Al_yTi_xN_z$ layer, wherein y is greater than x.

Step S360 illustrates an embodiment in which the amounts of $target_1$ and $target_2$ are controlled by varying the respective sputtering power levels of a first power source of $target_1$ and a second power source of $target_2$. However, other parameters can control the amounts of $target_1$ and $target_2$ in the sputtered coating. Parameters include, but are not limited to a flow rate of the reactive gas, a time of sputtering each target material, and a total time of alternately sputtering the target materials.

In step S370, a protective topcoat is applied to the sputtered coating, either reactive $layer_1$ or reactive $layer_2$, via a magnetron sputtering apparatus. The protective topcoat is applied to reactive $layer_1$ when step S350 is determined to be "YES." The protective topcoat is applied to reactive $layer_2$ when step S350 is determined to be "NO." In one embodiment, the protective topcoat is Plasil™. Plasil™ is a siloxane material, such as hexymethyldisiloxane (HMDSO). Tetramethyldisiloxane (TMDSO) is another siloxane material that can be used with embodiments described herein. HMDSO and tetramethyldisiloxane are described in the published patent CA 2294658C, which is incorporated in its entirety by reference herein. However, other materials that provide a clear protective coating to the reactive sputtered coating and provide protection from a harsh automotive lamp environment can be used for a protective topcoat.

Figure 3B:
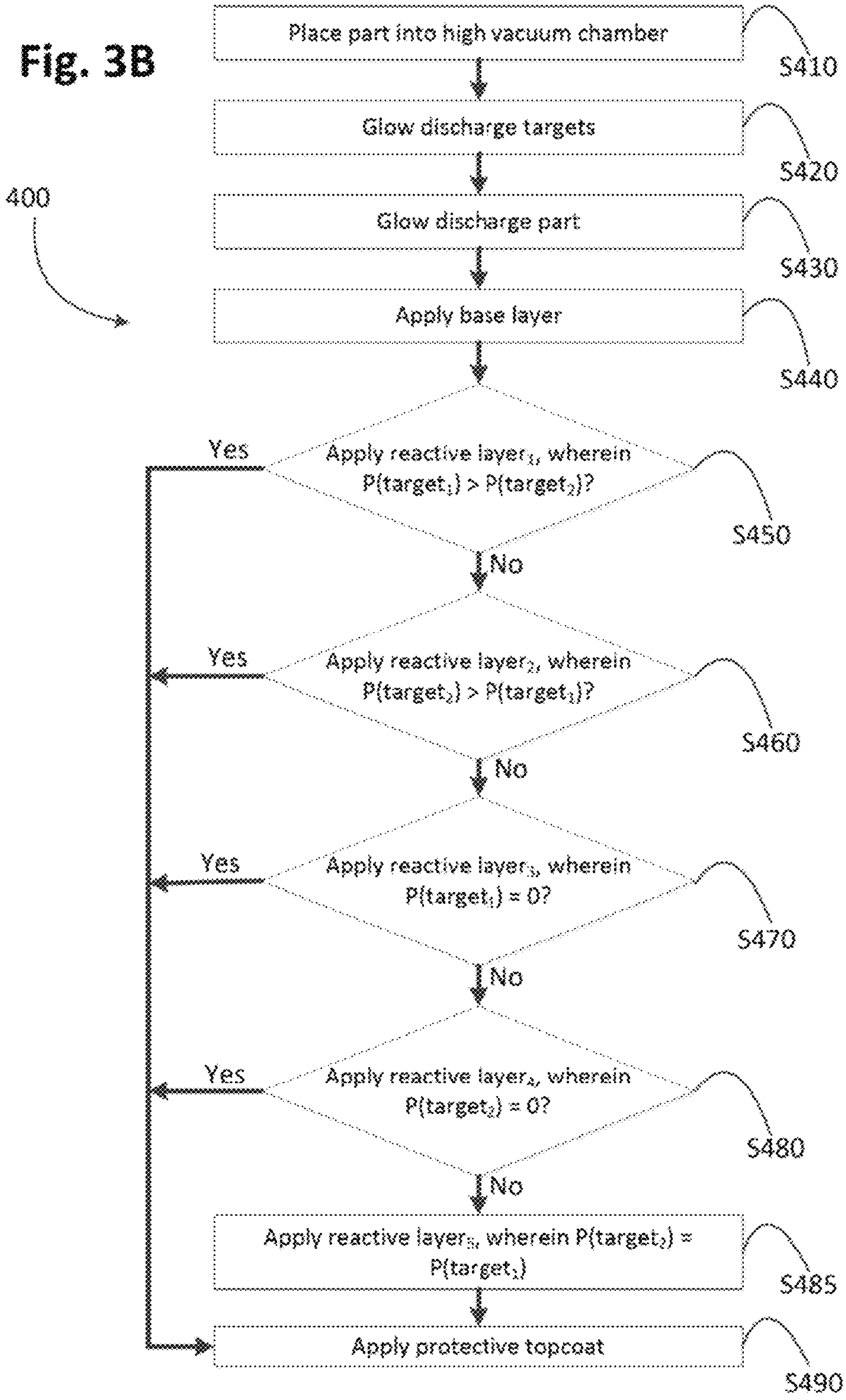
FIG. 3B illustrates a second exemplary algorithm for a process of coating a substrate using a magnetron sputtering apparatus according to one embodiment.

FIG. 3B illustrates a second exemplary algorithm 400 for a process of coating a substrate using a magnetron sputtering apparatus with the vacuum chamber 200 illustrated in FIG. 2. In step S410, a substrate is placed into the high vacuum chamber of the magnetron sputtering apparatus for application of a sputtered coating onto the substrate. In one embodiment, the substrate can be an automotive part and in particular, the substrate can be a component of an automotive lamp. In a second embodiment, the substrate can be made of plastic and in particular, the substrate can be made of polycarbonate or high-temperature polycarbonate.

In step S420, targets within the vacuum chamber are exposed to a glow discharge to remove oxides and/or other contaminants from the targets. In an example, multiple targets can be present within the vacuum chamber.

In step S430, the substrate is exposed to a glow discharge to remove any gases from the substrate. In addition, the glow discharge roughens the surface of the substrate.

In step S440, a base layer is applied. In one embodiment, the base layer includes a titanium layer or an aluminum layer. However, the base layer can include other components in which the base layer is a soft metal layer that adheres the substrate to a subsequent sputtered coating. In one embodiment, the base layer is approximately 30 nm thick.

In step S450, it is determined whether a reactive $layer_1$ is applied to the substrate, wherein a sputtering power level of $target_1$ is greater than a sputtering power level of $target_2$. The reactive $layer_1$ is formed using a reactive gas, such as nitrogen. A process gas, such as argon is also introduced into the vacuum chamber. The reactive $layer_1$ is formed by alternately sputtering $target_1$ and $target_2$, which reacts with the reactive gas to form a sputtered coating onto the substrate in the vacuum chamber. When the sputtering power level of $target_1$ is greater than the sputtering power level of $target_2$, a greater amount of $target_1$ is present in the sputtered coating. For example, when $target_1$ is titanium and $target_2$ is aluminum and the reactive gas is nitrogen, the sputtered coating includes a non-stoichiometric $Ti_xAl_yN_z$ layer, wherein x is greater than y, and z designates an amount of nitrogen in the coating. Nitrogen provides a hard sputtered coating. Therefore, the hardness can be increased by increasing the amount of nitrogen. The addition of nitrogen leads to formation of a hard nitride layer. The hardness of the coating can be increased by increasing the thickness of the reactive layer.

If reactive $layer_1$ is not applied to the substrate (a "NO" decision in step S450), it is determined whether a reactive $layer_2$ is applied to the substrate in step S460, wherein a sputtering power level of $target_2$ is greater than a sputtering power level of $target_1$. When the sputtering power level of $target_2$ is greater than the sputtering power level of $target_1$, a greater amount of $target_2$ is present in the sputtered coating. For example, when $target_1$ is titanium and $target_2$ is aluminum and the reactive gas is nitrogen, the sputtered coating includes a non-stoichiometric $Ti_xAl_yN_z$ layer, wherein y is greater than x.

If reactive $layer_2$ is not applied to the substrate (a "NO" decision in step S460), it is determined whether a reactive $layer_3$ is applied to the substrate in step S470, wherein a sputtering power level of $target_1$ is zero. In step S470, only one target is sputtered to react with a reactant gas to form the sputtered coating. For example, when $target_2$ is aluminum and the reactive gas is nitrogen, the sputtered coating includes an AlN layer.

If reactive $layer_3$ is not applied to the substrate (a "NO" decision in step S470), a reactive $layer_4$ is applied to the substrate in step S480, wherein a sputtering power level of $target_2$ is zero. In step S480, only one target is sputtered to react with a reactant gas to form the sputtered coating. For example, when $target_1$ is titanium and the reactive gas is nitrogen, the sputtered coating includes a TiN layer.

In step S485, a reactive $layer_1$ is applied to the substrate when the $P(target_1)=P(target_2)$. When both targets are powered equally, a resulting composition is $Ti_xAl_yN_z$, where x and y are equal.

In step S490, a protective topcoat is applied to the sputtered coating, which will be reactive $layer_1$, reactive $layer_2$, reactive $layer_3$, or reactive $layer_4$ or $layer_1$. The protective topcoat is applied to reactive $layer_1$ when step S450 is determined to be "YES." The protective topcoat is applied to reactive $layer_2$ when step S460 is determined to be "YES." The protective topcoat is applied to reactive $layer_3$ when step S470 is determined to be "YES." The protective topcoat is applied to reactive $layer_4$ when step S470 is determined to be "NO." The protective topcoat is applied to reactive $layer_1$ when step S480 is determined to be "NO."

In one embodiment, the protective topcoat is Plasil™. However, other materials that provide a clear protective coating to the reactive sputtered coating and provide protection from a harsh automotive lamp environment can be used for a protective topcoat.

The algorithms 300 and 400 of FIGS. 3A and 3B, respectively are illustrated using a first target material of titanium and a second target material of aluminum. However, other materials can be used in embodiments described herein. For example, the first target material can be copper and the second target material can be aluminum. When a nitrogen reactive gas is used, reactive $layer_1$ provides a sputtered coating of nonstoichiometric $Cu_xAl_yN_z$, wherein x is greater than y. When a nitrogen reactive gas is used, reactive $layer_2$ provides a sputtered coating of nonstoichiometric $Cu_xAl_yN_z$, wherein y is greater than x. When a nitrogen reactive gas is used, reactive $layer_3$ provides a sputtered coating of AlN. When a nitrogen reactive gas is used, reactive $layer_4$ provides a sputtered coating of CuN.

Embodiments are also described herein in which a reactive gas other than nitrogen is used. For example, acetylene and oxygen can be used or a combination of nitrogen and acetylene.

Figure 4:
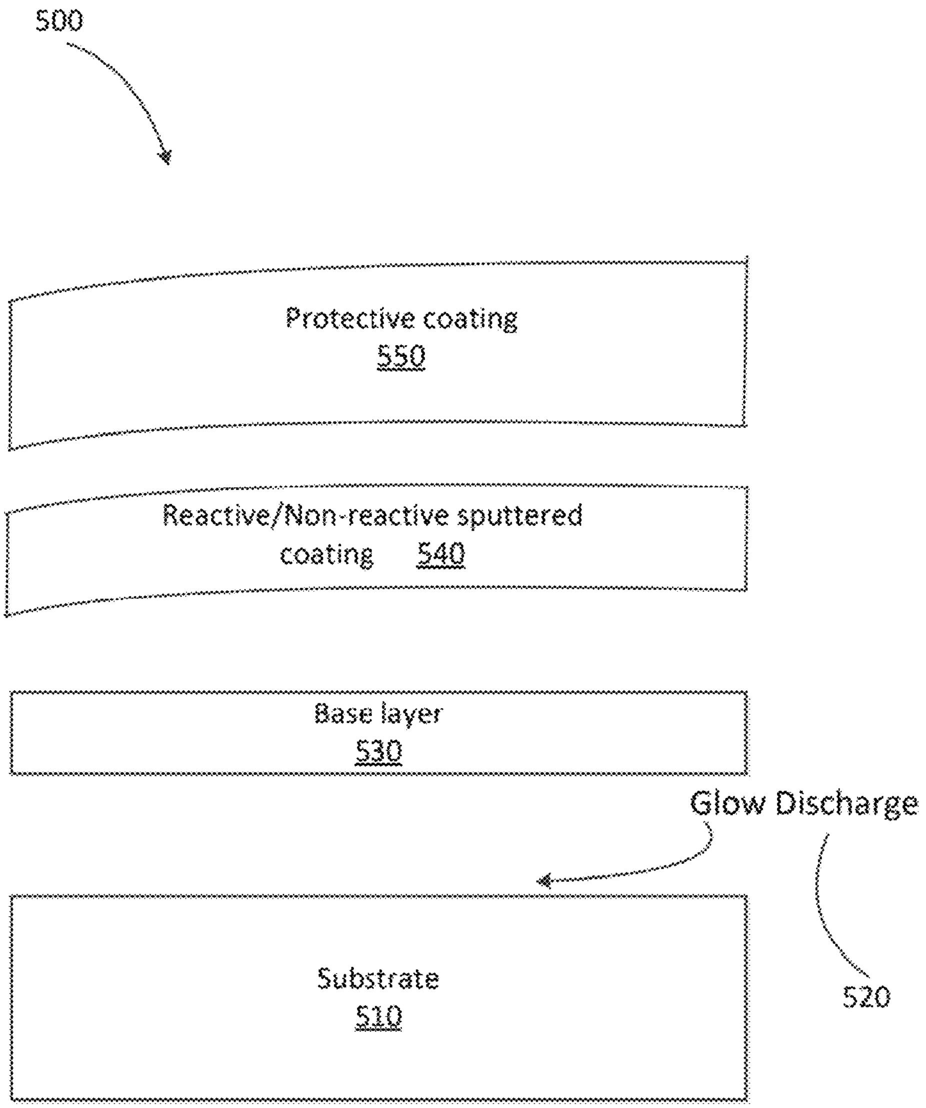
FIG. 4 illustrates an exemplary reactive sputtered part according to one embodiment.

FIG. 4 illustrates an exemplary reactive sputtered part 500 according to embodiments described herein. Reactive sputtered part 500 includes a substrate coated as a decorative and/or functional layer, which can be used as a reflector, a bezel, or a trim piece in the automotive industry and in particular, as a lamp reflector, a lamp bezel, or a lamp trim piece in the automotive industry.

A substrate 510 can include a polycarbonate material or a high-temperature polycarbonate material, acrylic, etc. However, other materials are contemplated by embodiments described herein. Substrate 510 is exposed to a glow discharge 520 to remove any gases, oxides, or other contaminants that are detrimental to the process. In addition, the glow discharge 520 roughens the substrate 510, such that a subsequent layer adheres to the substrate 510 better.

A base layer 530 is applied to the surface of the cleaned and roughened substrate 510. The base layer 530 includes a soft material that provides flexibility when the substrate 510 is flexed and remains adhered to the substrate 510 upon being flexed. In an example, the base layer 530 includes a titanium layer or an aluminum layer. However, other base layer materials are contemplated by embodiments described herein. The base layer 530 also enhances the final color of the finished substrate 500. In one embodiment, the base layer 530 is applied to the substrate 510 immediately after the glow discharge process to avoid re-contamination of the surface of the substrate 510.

A reactive/non-reactive sputtered coating 540 is applied to the base layer 530. The sputtered coating 540 can be applied according to algorithm 300 or algorithm 400 described herein. The sputtered coating 540 is adhered to the substrate 510 by the base layer 530.

A protective coating 550 is applied to the sputtered coating 540. In one embodiment, the protective coating is Plasil™. However, other materials that provide a clear protective coating to the sputtered coating 540 and provide protection from a harsh automotive lamp environment can be used for protective coating 550.

Embodiments described herein provide a mechanism for coating a plastic part in one of several different colors without the use of dyes. A variation in processing parameters of the reactive sputtered coating provides a broad spectrum of resulting colors. In addition, the resulting colors of the coated plastic substrate have a metallic appearance, rather than a cheap plastic appearance. The sputtered coatings of embodiments described herein, such as metal nitride coatings provide a decorative and functional layer for automotive lamp reflectors, bezels, and trim pieces. The sputtered coatings also can survive the harsh environment of automotive lamps. However, embodiments described herein can be used in other environments and for other uses, aside from the automotive industry.

Processing parameters include varying the amount of one or more metal components with respect to a reactive component, such as nitrogen. For example, $Ti_xAl_yN_z$, $Cu_xAl_yN_z$, $Ti_xN_z$, $Al_yN_z$, or $Cu_xN_z$ sputtered coatings can be applied to a substrate, wherein x, y, and z are variables that are equal to or less than one. The proportional amounts of each metal component and the reactive component determine in part, the resulting color on the substrate. The proportional amounts are controlled by controlling the sputtering time, the alternating sputtering time between two or more metal target materials, the power levels of the one or more power supplies that control the sputtering of the respective target materials, and the flow rates of the process and reactive gas components.

FIG. 5 is a table illustrating a plurality of recipes used to obtain a specific color on a substrate. The table of FIG. 5 is for illustrative purposes only and is not a complete list of all colors to be obtained using embodiments described herein. Embodiments described and claimed herein are not limited to the recipes illustrated in the table of FIG. 5.

The table of FIG. 5 illustrates a base layer applied to a substrate, such as base layer 530 applied to substrate 510 in FIG. 4. In FIG. 5, the base layer can be copper, aluminum, titanium, a combined copper/aluminum layer, or no base layer. The base layer is applied at a particular power level for a particular time using an argon processing gas.

The table of FIG. 5 also illustrates a reactive layer, such as the sputtered coating 540 illustrated in FIG. 4. The reactive layer can be aluminum, titanium, a combined titanium/aluminum layer, or no reactive layer. The reactive layer is applied at a particular power level for a particular time, using an argon processing gas and a nitrogen reactive gas.

The table of FIG. 5 also illustrates a protective topcoat, such as the protective coating 550 illustrated in FIG. 4. The protective topcoat is applied at a particular power level for a particular time using HMDSO, for example.

The particular compositions used for the base layers, reactive layers, and protective topcoat are for illustrative purposes only. Other compositions for any of the base layers, reactive layers, and protective topcoat are contemplated by embodiments described herein. A multiple composition base layer and/or a multiple composition reactive layer can be applied using a magnetron sputtering apparatus having multiple target sources, such as the magnetron sputtering apparatus illustrated in FIG. 2.

A number of patterns and relationships can be observed from the table of FIG. 5. For recipes 1-4, 7, and 10-11, only a base layer is applied to the substrate with no reactive layer.

For application of a copper base layer with no reactive layer, a higher power level and a higher processing time resulted in a lighter color, such as recipe 1. A copper base layer applied at a lower power level and a lower processing time with no reactive layer resulted in a darker color, such as recipes 2-3. The combined copper/aluminum base layer with no reactive layer resulted in a lighter color when processed at a moderate power level and a moderate processing time.

For application of a titanium base layer with no reactive layer, a higher power level and a higher processing time resulted in a lighter color, such as recipe 10. A titanium base layer applied at a lower power level and a lower processing time with no reactive layer resulted in a darker color, such as recipe 11.

For application of an aluminum base layer with no reactive layer, a moderate power level and a moderate processing time resulted in a lighter color, such as recipe 7.

For recipes 5, 12, and 13, only a reactive layer was applied with no base layer. Each of the three recipes resulted in a black layer with various colored undertones, such as a green undertone (recipe 5), a silver undertone (recipe 12), and a blue undertone (recipe 13).

For recipes 6, 8-9, and 14-20, a base layer and a reactive layer were both applied to a substrate. For a titanium base layer and a titanium reactive layer, a longer reactive processing time resulted in darker colors (recipes 18-19) and a shorter reactive processing time resulted in a lighter color (recipe 20). For a titanium base layer and a titanium/aluminum reactive layer, a higher nitrogen level resulted in a darker color (recipe 16) and a lower nitrogen level resulted in a lighter color (recipe 17).

For an aluminum base layer and a titanium reactive layer, a higher power level and a higher nitrogen level resulted in a deeper color (recipe 8). A lower power level and a lower nitrogen level resulted in a lighter color (recipe 9).

For an aluminum base layer and a titanium/aluminum reactive layer, a longer reactive processing time resulted in a green color (recipe 14), wherein the power level for both the titanium and aluminum targets was the same. A shorter reactive processing time resulted in a bronze color (recipe 15), wherein the power level for both the titanium and aluminum targets was the same.

Parameters for the base layer composition, power level, and processing time are discussed herein. The reactive layer composition, power level, and processing time are also discussed herein. The table in FIG. 4 illustrates other parameters that also have an effect on the resulting color. In a first relationship, the argon concentration determines how much of the metal composition is deposited onto the substrate, which has a direct impact on the resulting color. The first relationship applies for both the base layer and the reactive layer.

In a second relationship, the protective topcoat processing power level and time can be varied to impact the resulting color. The protective topcoat parameters have little or no effect when the deposition time is less than thirty seconds. However, when the deposition time is greater than thirty seconds and in particular, is sixty seconds or higher, a yellow effect is produced, which can change the appearance of the final substrate color. For example, a sea green effect in recipe 14 can be achieved by an interference of a yellow appearance from the protective topcoat.

In a third relationship, a color of the base layer can affect the final composition and color of the substrate. For example, a titanium base layer results in a predominantly titanium composition of a TiAlN resulting layer. Likewise, an aluminum base layer results in a predominantly aluminum composition of an AlTiN resulting layer. A TiAlN resulting color is different from an AlTiN resulting color.

The base layer also affects the shade of the resulting substrate color. For example, lighter shades, such as gold and bronze can be achieved by using an aluminum base layer. Likewise, darker shades can be achieved by using a titanium base layer.

Other parameters and/or relationships can affect the resulting substrate color, such as the amount of nitrogen introduced in the chamber. More nitrogen leads to saturation, which results in a brown color, while lower amounts of nitrogen result in a gold color. The addition of extra reactive gases with nitrogen, such as acetylene results in a dark blue or black color.

A hardware description of an exemplary computing device 600 used in accordance with embodiments herein is described with reference to FIG. 6. Computing device 600 can be used with the vacuum chamber 200 of a magnetron sputtering apparatus and associated bus 270 as illustrated in FIG. 2.

Computing device 600 is intended to represent various forms of digital hardware, such as laptops, desktops, workstations, personal digital assistants, servers, blade servers, mainframes, and other appropriate computers. The components shown here, their connections and relationships, and their functions are meant to be examples only and are not meant to be limiting.

The computing device 600 includes a processor 601, a memory 602, a storage device 604, a high-speed interface 612 connecting to the memory 602 and multiple high-speed expansion ports 616, and a low-speed interface 610 connecting to a low-speed expansion port 614 and the storage device 604. Each of the processor 601, the memory 602, the storage device 604, the high-speed interface 612, the high-speed expansion ports 616, and the low-speed interface 610 are interconnected using various busses, such as communication bus 626, and may be mounted on a common motherboard or in other manners as appropriate.

The processor 601 can process instructions for execution within the computing device 600, including instructions stored in the memory 602 or on the storage device 604 to display graphical information for a GUI on an external input/output device, such as a display 608 coupled to the high-speed interface 612. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system). The memory 602 stores information within the computing device 600. In some implementations, the memory 602 is a volatile memory unit or units. In some implementations, the memory 602 is a non-volatile memory unit or units. The memory 602 can also be another form of computer-readable medium, such as a magnetic or optical disk.

The storage device 604 is capable of providing mass storage for the computing device 600. In some implementations, the storage device 604 can be or contain a computer-readable medium, such as a floppy disk device, a hard disk device, an optical disk device, a tape device, a flash memory or other similar solid state memory device, or an array of devices, including devices in a storage area network or other configurations. Instructions can be stored in an information carrier. The instructions, when executed by one or more processing devices (for example, processor 601), perform one or more methods, such as those described above. The instructions can also be stored by one or more storage devices, such as computer- or machine-readable mediums (for example, the memory 602, the storage device 604, or memory on the processor 601).

The high-speed interface 612 manages bandwidth-intensive operations for the computing device 600, while the low-speed interface 610 manages lower bandwidth-intensive operations. Such allocation of functions is an example only. In some implementations, the high-speed interface 612 is coupled to the memory 602, the display 608 (e.g., through a graphics processor or accelerator), and to the high-speed expansion ports 616, which may accept various expansion cards (not shown). In the implementation, the low-speed interface 610 is coupled to the storage device 604 and the low-speed expansion port 614. The low-speed expansion port 614, which can include various communication ports (e.g., USB, Bluetooth, Ethernet, wireless Ethernet) can be coupled to one or more input/output devices 618, such as a keyboard, a pointing device, a scanner, or a networking device such as a switch or router, e.g., through a network adapter.

The computing device 600 also includes a network controller 606, such as an Intel Ethernet PRO network interface card from Intel Corporation of America, for interfacing with a network 99. As can be appreciated, the network 99 can be a public network, such as the Internet, or a private network such as an LAN or WAN network, or any combination thereof and can also include PSTN or ISDN sub-networks. The network 99 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

Figure 6:
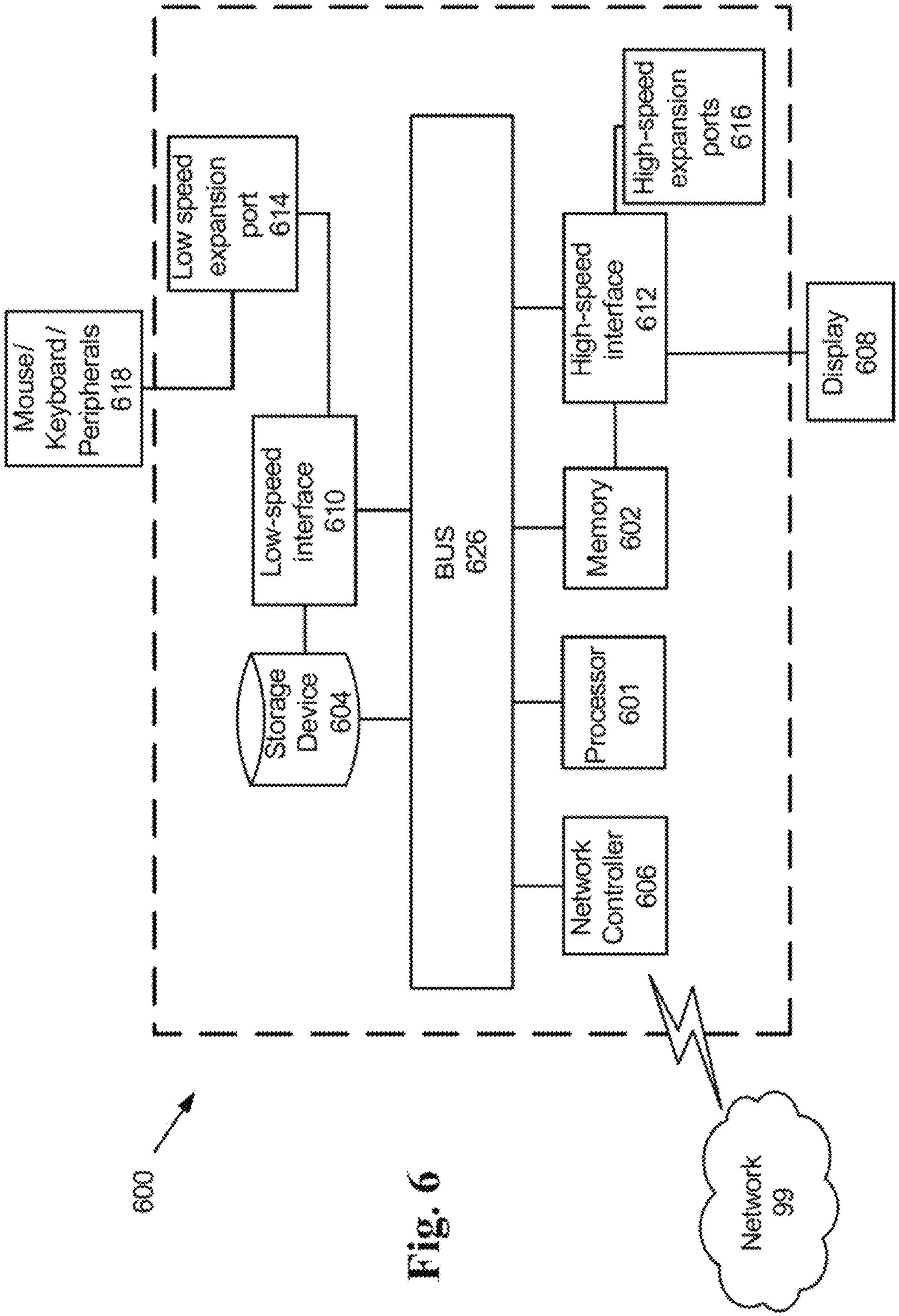
FIG. 6 is a block diagram of an exemplary computing device according to one embodiment.

Although the computing device 600 of FIG. 6 is described as having a storage medium device 604, the claimed advancements are not limited by the form of the computer-readable media on which the instructions of the described processes are stored. For example, the instructions can be stored on CDs, DVDs, in FLASH memory, RAM, ROM, PROM, EPROM, EEPROM, hard disk, or any other information processing device with which the computing device communicates.

In other alternate embodiments, processing features according to the present disclosure may be implemented and commercialized as hardware, a software solution, or a combination thereof. Moreover, instructions corresponding to processes described herein could be stored in a portable drive, such as a USB Flash drive that hosts a secure process.

Computer programs (also known as programs, software, software applications, or code) associated with the processes described herein include machine instructions for a programmable processor, and can be implemented in a high-level procedural and/or object-oriented programming language, and/or in assembly/machine language. As used herein, the terms machine-readable medium and computer-readable medium refer to any computer program product, apparatus, and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described herein can be implemented on a computer having a display device 608 (e.g., a CRT (cathode ray tube) or LCD (liquid crystal display) monitor) for displaying information to the user and a keyboard and a pointing device 618 (e.g., a mouse or a trackball) by which the user can provide input to the computer. Other kinds of devices can be used to provide for interaction with a user as well. For example, feedback provided to the user can be any form of sensory feedback (e.g., visual feedback, auditory feedback, or tactile feedback), and input from the user can be received in any form, including acoustic, speech, or tactile input.

The systems and techniques described herein can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Figure 7:
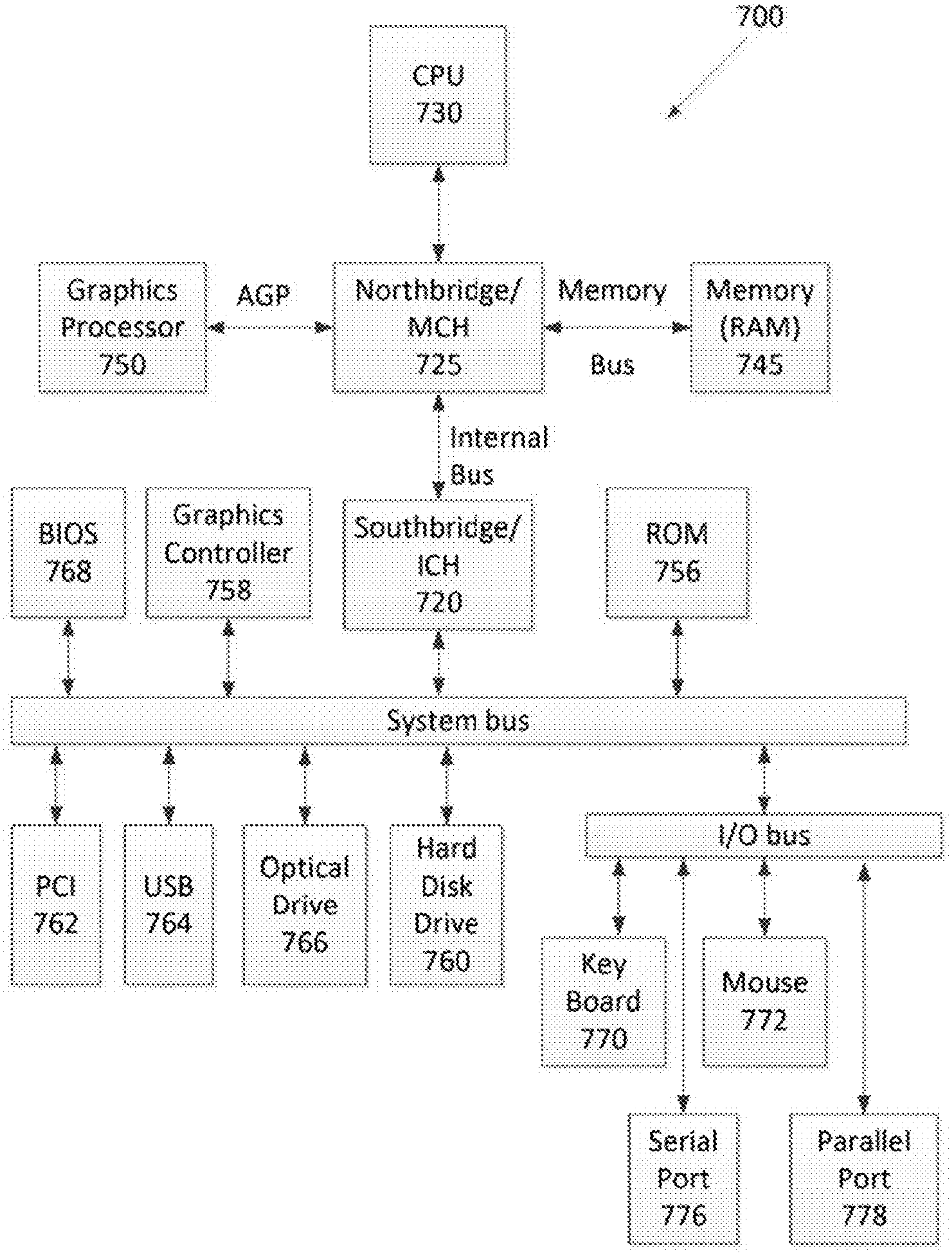
FIG. 7 is a schematic diagram of an exemplary data processing system according to one embodiment.

FIG. 7 shows a schematic diagram of an exemplary data processing system, according to aspects of the disclosure described herein for performing menu navigation, as described above. The data processing system is an example of a computer in which code or instructions implementing the processes of the illustrative embodiments can be located.

In FIG. 7, data processing system 700 employs an application architecture including a north bridge and memory controller hub (NB/MCH) 725 and a south bridge and input/output (I/O) controller hub (SB/ICH) 720. The central processing unit (CPU) 730 is connected to NB/MCH 725. The NB/MCH 725 also connects to the memory 745 via a memory bus, and connects to the graphics processor 750 via an accelerated graphics port (AGP). The NB/MCH 725 also connects to the SB/ICH 720 via an internal bus (e.g., a unified media interface or a direct media interface). The CPU 730 can contain one or more processors and even can be implemented using one or more heterogeneous processor systems.

Figure 8:
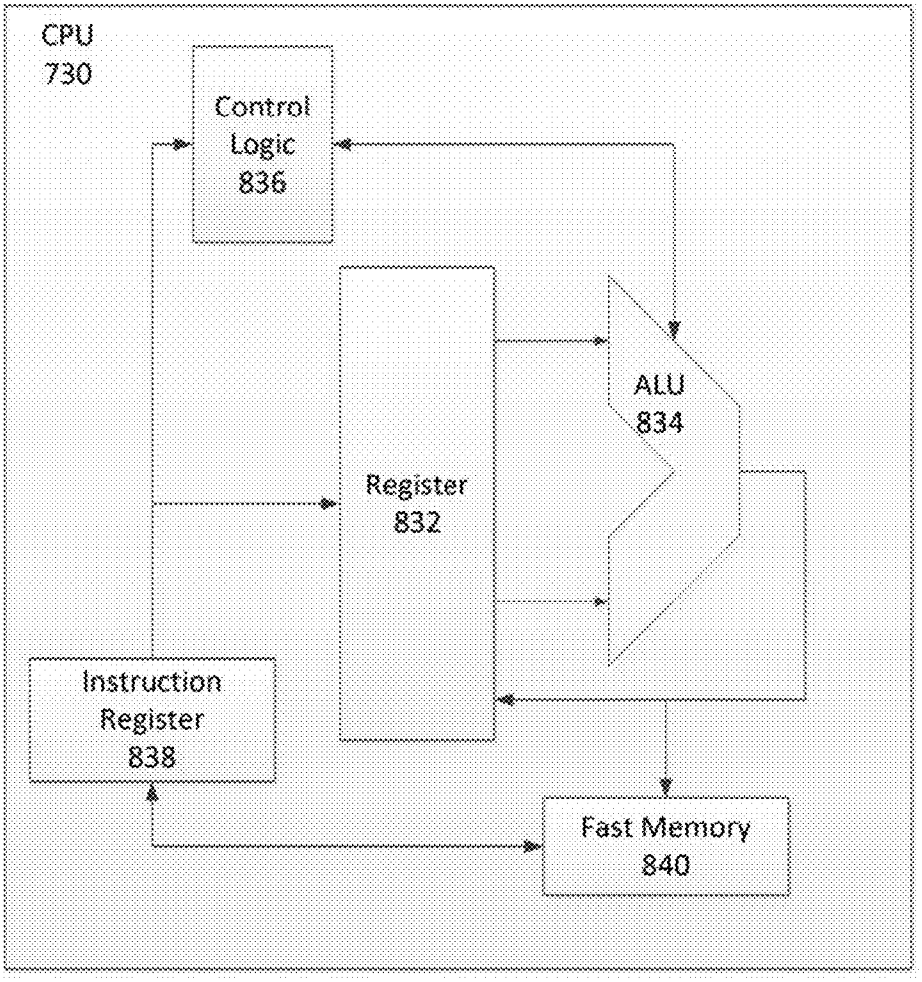
FIG. 8 illustrates one implementation of a central processing unit (CPU) according to one embodiment.

For example, FIG. 8 illustrates one implementation of CPU 730. In one implementation, an instruction register 838 retrieves instructions from a fast memory 840. At least part of these instructions are fetched from an instruction register 838 by a control logic 836 and interpreted according to the instruction set architecture of the CPU 730. Part of the instructions can also be directed to a register 832. In one implementation the instructions are decoded according to a hardwired method, and in another implementation the instructions are decoded according to a microprogram that translates instructions into sets of CPU configuration signals that are applied sequentially over multiple clock pulses.

After fetching and decoding the instructions, the instructions are executed using an arithmetic logic unit (ALU) 834 that loads values from the register 832 and performs logical and mathematical operations on the loaded values according to the instructions. The results from these operations can be fed back into the register 832 and/or stored in a fast memory 840. According to aspects of the disclosure, the instruction set architecture of the CPU 730 can use a reduced instruction set computer (RISC), a complex instruction set computer (CISC), a vector processor architecture, or a very long instruction word (VLIW) architecture. Furthermore, the CPU 730 can be based on the Von Neuman model or the Harvard model. The CPU 730 can be a digital signal processor, an FPGA, an ASIC, a PLA, a PLD, or a CPLD. Further, the CPU 730 can be an x86 processor by Intel or by AMD; an ARM processor; a Power architecture processor by, e.g., IBM; a SPARC architecture processor by Sun Microsystems or by Oracle; or other known CPU architectures.

Referring again to FIG. 7, the data processing system 700 can include the SB/ICH 720 being coupled through a system bus to an I/O Bus, a read only memory (ROM) 756, universal serial bus (USB) port 764, a flash binary input/ output system (BIOS) 768, and a graphics controller 758. PCI/PCIe devices can also be coupled to SB/ICH 720 through a PCI bus 762.

The PCI devices can include, for example, Ethernet adapters, add-in cards, and PC cards for notebook computers. The Hard disk drive 760 and CD-ROM 766 can use, for example, an integrated drive electronics (IDE) or serial advanced technology attachment (SATA) interface. In one implementation the I/O bus can include a super I/O (SIO) device.

Further, the hard disk drive (HDD) 760 and optical drive 766 can also be coupled to the SB/ICH 720 through a system bus. In one implementation, a keyboard 770, a mouse 772, a parallel port 778, and a serial port 776 can be connected to the system bus through the I/O bus. Other peripherals and devices can be connected to the SB/ICH 720 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein can also be executed by various distributed components of a system. For example, one or more processors can execute these system functions, wherein the processors are distributed across multiple components communicating in a network. The distributed components can include one or more client and server machines, which can share processing, such as a cloud computing system, in addition to various human interface and communication devices (e.g., display monitors, smart phones, tablets, personal digital assistants (PDAs)). The network can be a private network, such as a LAN or WAN, or can be a public network, such as the Internet. Input to the system can be received via direct user input and received remotely either in real-time or as a batch process. Additionally, some implementations can be performed on modules or hardware not identical to those described. Accordingly, other implementations are within the scope that can be claimed.

The functions and features described herein may also be executed by various distributed components of a system. For example, one or more processors may execute these system functions, wherein the processors are distributed across multiple components communicating in a network. For example, distributed performance of the processing functions can be realized using grid computing or cloud computing. Many modalities of remote and distributed computing can be referred to under the umbrella of cloud computing, including: software as a service, platform as a service, data as a service, and infrastructure as a service. Cloud computing generally refers to processing performed at centralized locations and accessible to multiple users who interact with the centralized processing locations through individual terminals.

Embodiments described herein can be implemented in conjunction with one or more of the devices described above with reference to FIGS. 6-8. Embodiments are a combination of hardware and software, and processing circuitry by which the software is implemented.

Figure 9:
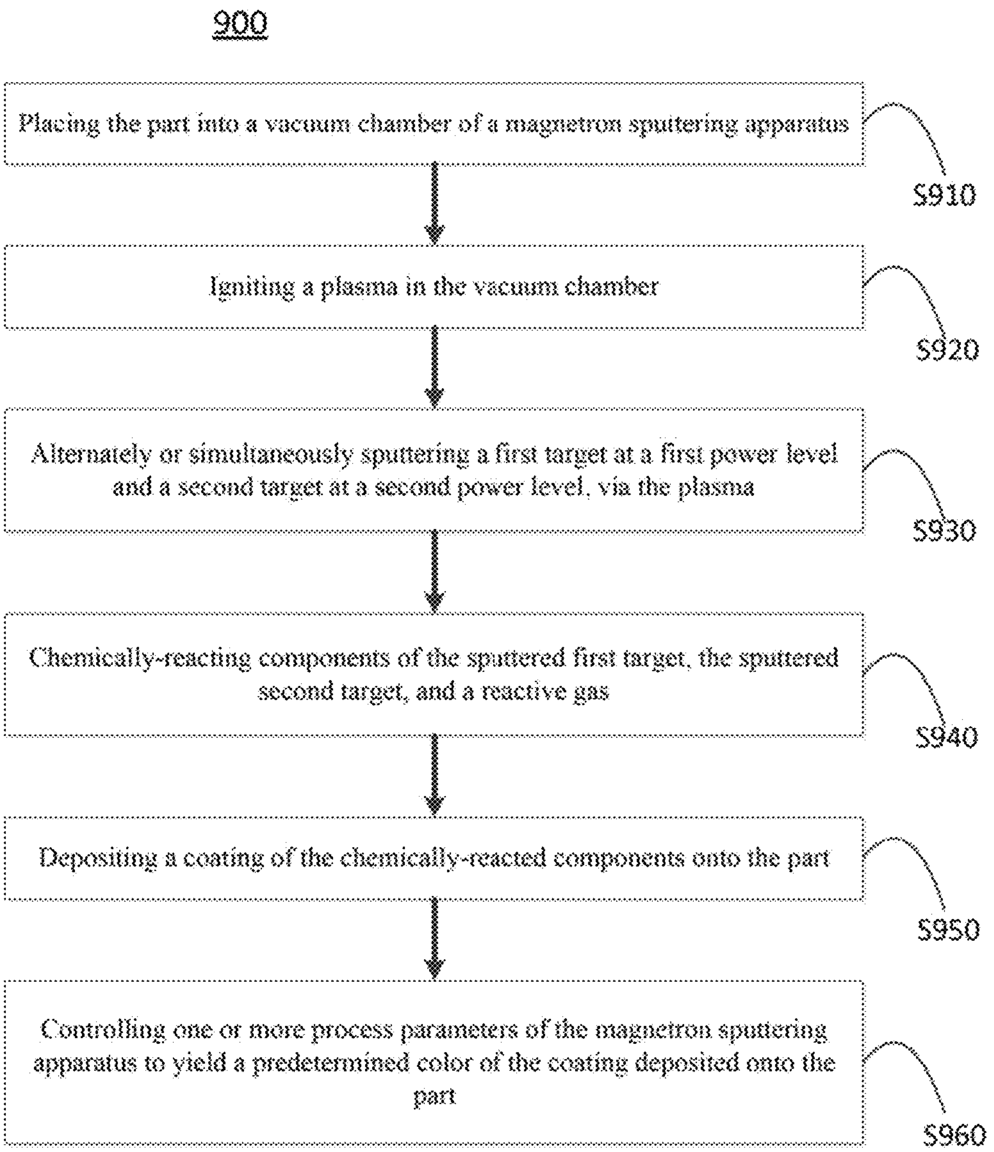
FIG. 9 is a flowchart for an exemplary method of coating a part according to one embodiment.

FIG. 9 is a flowchart for an exemplary method 900 of treating and coating a part, such as substrate 510. In step S910, the part is placed into a vacuum chamber of a magnetron sputtering apparatus. The part is placed onto a platform, such as platform 210 within the vacuum chamber. The part can also be mounted on a rotating reel.

In step S920, a plasma is ignited in the vacuum chamber. In one embodiment, multiple power sources are present in the vacuum chamber.

In step S930, a first target at a first power level is alternately or simultaneously sputtered with a second target at a second power level, via the plasma. The first and second targets are alternately or simultaneously sputtered, via a switch that controls a first power source and a second power source, respectively.

In step S940, components of the sputtered first target, the sputtered second target, and a reactive gas are chemically reacted. In an example, a sputtered titanium target, an aluminum sputtered target, and nitrogen gas are chemically reacted within the vacuum chamber to form a non-stoichiometric $Ti_xAl_yN_z$ sputtered layer, wherein x, y, and z are variables and are less than or equal to one.

In step S950, a coating of the chemically-reacted components is deposited onto the part. In an example, the coating is deposited onto a base layer, such as base layer 530, which adheres the deposited coating onto the part.

In step S960, one or more process parameters of the magnetron sputtering apparatus are controlled to yield a predetermined color of the coating deposited onto the part. Process parameters include, but are not limited to a flow rate of the reactive gas, a time of sputtering each target material, and a total time of alternately sputtering the target materials.

Embodiments described herein provide a broad spectrum of colors for a material deposited onto a substrate. The resulting color can be controlled through several sputtered processing parameters. The deposited material adheres well onto a pliable plastic substrate, which has a high survivability rate in a harsh automotive lamp environment. In addition, the resulting color has the sheen and appearance of a colored metallic substrate.

While certain embodiments have been described herein, these embodiments are presented by way of example only, and are not intended to limit the scope of the disclosure. Using the teachings in this disclosure, a person having ordinary skill in the art can modify and adapt the disclosure in various ways, making omissions, substitutions, and/or changes in the form of the embodiments described herein, without departing from the spirit of the disclosure. Moreover, in interpreting the disclosure, all terms should be interpreted in the broadest possible manner consistent with the context. The accompanying claims and their equivalents are intended to cover such forms or modifications, as would fall within the scope and spirit of the disclosure.

The invention claimed is:

1. A treated and coated part of an automotive trim piece, comprising:

a plastic substrate having a glow-discharged surface;

a base layer adhered to the plastic substrate, wherein the base layer is a composition material of titanium, aluminum or copper;

a magnetron sputtered coating adhered to the base layer, wherein the magnetron sputtered coating is a chemically-reactive, non-stoichiometric, ceramic metal coating; and the treated and coated part of the automotive trim piece is produced by a process of:

presenting an uncoated part of the automotive trim piece for treatment and coating;

placing the uncoated part of the automotive trim piece in a vacuum chamber of a magnetron sputtering apparatus;

operating the magnetron sputtering apparatus in a process that is configured to produce the treated and coated part of the automotive trim piece based on a composition of said base layer, a composition of said chemically-reactive, non-stoichiometric, ceramic metal coating of a number of sputtered targets and a composition of a sputtering reactive gas, where the number of sputtered targets includes at least one material of titanium or aluminum or copper; and controlling a number of process parameters of the magnetron sputtering apparatus selected from a group of said process parameters including:

power levels operating at 20 kW-60 kW, processing times, a reactive gas component, a concentration of Argon process gas;

which are configured to provide a resultant color of the automotive trim piece from a chemical reaction between reactants of said number of sputtered targets and reactants of the sputtering reactive gas;

omitting or applying a protective coating that adheres to the magnetron sputtered coating;

the treated and coated part of the automotive trim piece yields a predetermined color and metallic appearance of the magnetron sputtered coating deposited onto the automotive trim piece.

2. The treated and coated part of an automotive trim piece of claim 1, wherein the plastic substrate includes an automotive bezel or an automotive trim piece.

3. The treated and coated part of an automotive trim piece of claim 1, wherein the plastic substrate includes an automotive lamp bezel or an automotive lamp trim piece.

4. The treated and coated part of an automotive trim piece of claim 1, wherein the plastic substrate includes one of polycarbonate and high-temperature polycarbonate.

5. The treated and coated part of an automotive trim piece of claim 1, wherein the protective coating includes one of hexymethyldisiloxane (HMDSO) and tetramethyldisiloxane (TMDSO).

6. The treated and coated part of an automotive trim piece of claim 1, wherein the base layer is approximately 20-100 nm thick.

7. The treated and coated part of an automotive trim piece of claim 1, wherein the protective coating forms a topcoat of the treated and coated part of an automotive trim piece.

8. The treated and coated part of an automotive trim piece of claim 1, wherein the sputtering reactive gas includes one of nitrogen, acetylene or a combination of nitrogen and acetylene.

9. The treated and coated part of an automotive trim piece of claim 1, wherein the base layer includes an alternate composition material that is distinguished from the composition material that includes silver, nickel or steel.

10. A treated and coated part of an automotive trim piece, comprising:

a plastic substrate having a glow-discharged surface;

a base layer adhered to the plastic substrate, wherein the base layer is a composition of titanium, aluminum or copper;

a magnetron sputtered coating adhered to the base layer, wherein the magnetron sputtered coating is a chemically-reactive, non-stoichiometric, ceramic metal coating; and the treated and coated part of the automotive trim piece produced by a process of:

presenting an uncoated part of the automotive trim piece for treatment and coating;

placing the uncoated part of the automotive trim piece in a vacuum chamber of the magnetron sputtering apparatus;

operating the magnetron sputtering apparatus in a process that is configured to produce the treated and coated part of the automotive trim piece based on a composition of said base layer, a composition of said chemically-reactive, non-stoichiometric, ceramic metal coating of a number of sputtered targets and a composition of a sputtering reactive gas, where the number of sputtered targets includes at least one material of titanium or aluminum or copper; and controlling a number of process parameters of the magnetron sputtering apparatus selected from a group of said process parameters including:

power levels between 20 kW-60 kW, processing times, a reactive gas component, a concentration of Argon process gas;

which are configured to provide a resultant color of the automotive trim piece from a chemical reaction between reactants of said number of sputtered targets and reactants of the sputtering reactive gas;

applying a protective coating that adheres to the magnetron sputtered coating;

the treated and coated part of the automotive trim piece yields a predetermined color and metallic appearance of the magnetron sputtered coating deposited onto the automotive trim piece.

* * * * *